United States Patent [19]

Yamazaki et al.

[11] Patent Number: 4,758,805

[45] Date of Patent: Jul. 19, 1988

[54] HIGH FREQUENCY INTERFERENCE PREVENTION FILTER FOR ELECTRIC INSTRUMENTS

[75] Inventors: Toworu Yamazaki, Kariya; Takashi Sakurai, Nagoya, both of Japan

[73] Assignee: Nippondenso Co., Ltd., Kariya, Japan

[21] Appl. No.: 664,292

[22] Filed: Oct. 24, 1984

[30] Foreign Application Priority Data

Oct. 28, 1983 [JP] Japan ................ 58-203203
Oct. 31, 1983 [JP] Japan ................ 58-204378

[51] Int. Cl.$^4$ ................ H01P 1/20; H01P 1/203
[52] U.S. Cl. ................ 333/12; 333/204; 333/185
[58] Field of Search ........... 333/202, 204, 246, 185, 333/181, 12, 1

[56] References Cited

U.S. PATENT DOCUMENTS

| | | | |
|---|---|---|---|
| 1,664,494 | 4/1928 | Smith | 361/119 |
| 2,055,057 | 9/1936 | Allen | 307/90 |
| 2,498,824 | 2/1950 | Rady | 307/90 |
| 2,621,251 | 12/1952 | Pontius | 333/181 |
| 2,714,194 | 7/1955 | Beynink | 333/12 X |
| 3,189,847 | 6/1965 | Rymaszewski et al. | 333/12 X |
| 3,218,585 | 11/1965 | May | 333/246 |
| 3,221,286 | 11/1965 | Fedde | 333/260 X |
| 3,683,271 | 8/1972 | Kobayashi | 336/181 X |
| 3,806,767 | 4/1974 | Lehrfeld | 333/260 X |
| 3,934,074 | 1/1976 | Evelove | 174/52 R |
| 4,465,538 | 8/1984 | Schmoock | 156/233 |
| 4,480,240 | 10/1984 | Gould | 333/246 |

FOREIGN PATENT DOCUMENTS

| | | | |
|---|---|---|---|
| 974384 | 12/1960 | Fed. Rep. of Germany | 333/79 |
| 879449 | 2/1942 | France | 361/113 |

*Primary Examiner*—Eugene R. LaRoche
*Assistant Examiner*—Benny Lee
*Attorney, Agent, or Firm*—Cushman, Darby & Cushman

[57] ABSTRACT

A high frequency filter for an electric instrument including a conductive casing insulated on a stationary structure, an internal electric circuit arranged within the casing, and a connector mounted on the casing for connecting the internal electric circuit to an external electric circuit. The filter comprises an insulation thin plate arranged between the connector and the internal electric circuit and being folded at its intermediate portion, a pair of conductive thin plates secured to opposite surfaces of the insulation thin plate and extending along the folded portion of the insulation thin plate, one of the conductive thin plates being connected at its one end to the connector and at its other end to the internal electric circuit, and the other conductive thin plate being connected to a portion of the casing to provide a short circuit. In such arrangement, the conductive thin plates are opposed to each other through the insulation thin plate to provide a distributed constant circuit.

9 Claims, 7 Drawing Sheets

HIGH FREQUENCY INTERFERENCE PREVENTION FILTER FOR ELECTRIC INSTRUMENTS

BACKGROUND OF THE INVENTION

The present invention relates to a high frequency filter for electric instruments, and more particularly to a high frequency filter for protecting the electric instruments from inductive interference caused by various electromagnetic waves from a broadcasting station, an amateur wireless station, a civil wireless station, a personal wireless system, a military radar system and the like.

Although various high frequency filters of this kind have been proposed, reliable protection of electric instruments from inductive interference has been difficult due to insufficient band width of the filter characteristic. Meanwhile, a presently proposed high frequency filter effective in a broad radio frequency band is costly in manufacture.

SUMMARY OF THE INVENTION

A primary object of the present invention is to provide a high frequency filter which is constructed at a low cost to provide a distributed constant circuit effective in a broad radio frequency band.

Another object of the present invention is to provide a high frequency filter which is constructed in a simple manner to provide a concentrated constant circuit effective in a low radio frequency band and to provide a distributed constant circuit effective in a high radio frequency band.

According to the present invention there is provided a high frequency filter for an electric instrument including a casing of conductive metal insulated on a stationary structure, an internal electric circuit arranged within the conductive casing, and a connector mounted on a peripheral wall of the casing for connecting the internal electric circuit to an external electric circuit. The high frequency filter comprises an insulation thin plate the whole length of which is larger than the distance between the connector and a connection terminal of the internal electric circuit, the insulation thin plate being folded at its intermediate portion to be arranged between the connector and the connection terminal of the circuit, a pair of conductive thin plates secured to opposite surfaces of the insulation thin plate and extending along the folded portion of the insulation thin plate, one of the conductive thin plates being connected at one end thereof to the connector and at the other end thereof to the connection terminal of the internal electric circuit, and the other conductive thin plate being connected to a portion of the casing to provide a short circuit. In such an arrangement, the conductive thin plates are opposed to each other through the folded insulation thin plate to provide a distributed constant circuit effective in a broad radio frequency band. Preferably, the high frequency filter further comprises a capacitor of small electrostatic capacitance mounted on the insulation thin plate and connected at one end thereof to the one of the conductive thin plates and at the other end thereof to the other conductive thin plate to provide a concentrated constant circuit effective in a low radio frequency band.

BRIEF DESCRIPTION OF THE DRAWINGS

Additional objects and advantages of the present invention will be more readily apparent from the following detailed description of preferred embodiments thereof when taken together with the attached drawings, in which.

DETAILED DESCRIPTION OF THE PREFERRED EMBODIMENTS

Figure 1:
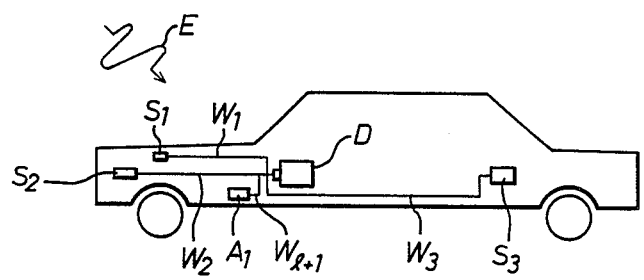
FIG. 1 is a schematic illustration of an automotive vehicle equipped with an electronic control system.

Referring now to the drawings, particularly in FIG. 1 there is illustrated an automotive vehicle equipped with an electronic control system which comprises a plurality of sensors $S_1, S_2, S_3 \ldots S_n$, a plurality of actuators $A_1, A_2 \ldots A_n$, and an electronic control device D connected to the sensors, actuators and a battery (not shown) by way of leading wires $W_1, W_2, W_3 \ldots W_n$. (In the figure, only the sensors $S_1, S_2, S_3$ and actuator $A_1$ are illustrated.) In such arrangement, each length of leading wires $W_1, W_2, W_3 \ldots W_n$ is deteremined by the relative arrangement among the respective sensors $S_1, S_2, S_3 \ldots S_n$, actuators $A_1 \ldots A_n$, the battery, and the electronic control device D.

Figure 2:
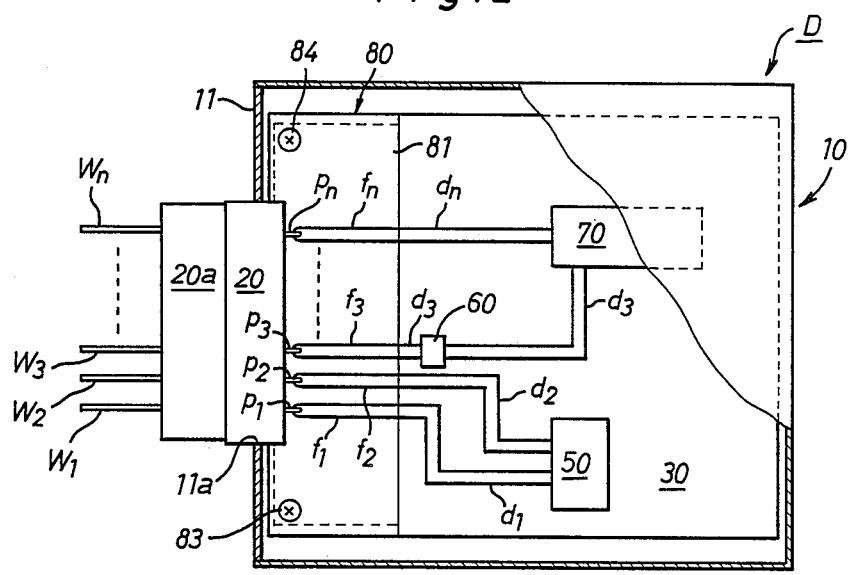
FIG. 2 is a transversely sectional view of an electronic control device adapted to the system of FIG. 1.
Figure 3:
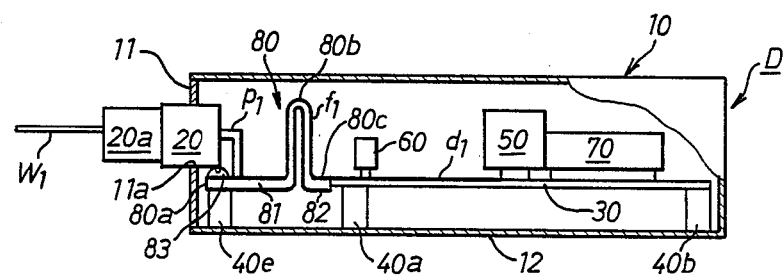
FIG. 3 illustrates a vertical section of the electronic control device.

As is illustrated in FIGS. 2 and 3, the electronic control device D includes a casing 10 of conductive metal mounted in an insulated manner on a stationary structure in the passenger compartment of the vehicle, and a connector 20 carried on the front wall 11 of casing 10. The connector 20 is fixedly coupled with a rectangular hole 11a in the front wall 11 and carries thereon a connector 20a in connection to the leading wires $W_1, W_2, W_3 \ldots W_n$. The connector 20 is provided with a plurality of L-letter shaped connection pins $P_1, P_2, P_3 \ldots P_n$ which are arranged in parallel to each other and connected respectively at their inner ends to the leading wires $W_1, W_2, W_3 \ldots W_n$ through the connector 20a.

Arranged within the casing 10 is a printed circuit board 30 of insulation material which is carried on the bottom wall 12 of casing 10 by means of four support members 40a, 40b, 40c and 40d made of conductive metal. (In FIG. 3, only the support members 40a and 40b are illustrated.) Fixedly mounted on the printed circuit board 30 are a power source circuit 50, a switching circuit 60 and a microcomputer 70. As can be well seen in FIGS. 2 and 3, the power source circuit 50 has a pair of terminals connected to internal terminals of a pair of conductive wiring layers or strips $d_1, d_2$ formed on the surface of printed circuit board 30. The switching circuit 60 has a pair of opposite terminals connected to conductive wiring layers or strips $d_3$, formed on the surface of printed circuit board 30. The microcomputer 70 has a first terminal connected to the switching circuit 60 through the wiring layer $d_3$ and a second terminal connected to the internal terminal of a conductive wiring layer $d_n$ formed on print board 30. The other terminals of microcomputer 70 (not shown) are connected to the other conductive wiring layers or strips $d_4 \ldots d_{n-1}$ (not shown) which are formed on the print board 30 in the same manner as the wiring layers $d_1, d_2, d_3$ and $d_n$.

Figure 4:
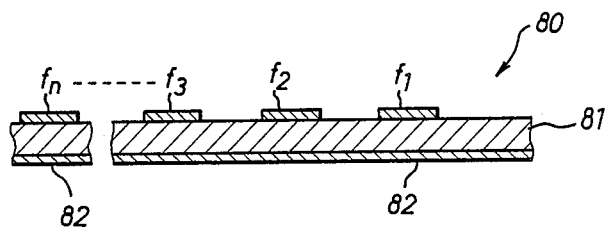
FIG. 4 illustrates a partial cross-section of a high frequency filter adapted to the electronic control device shown in FIGS. 2 and 3.

As can be well seen in FIGS. 2-4, a high frequency filter 80 in accordance with the present invention is interposed between the front wall 11 of casing 10 and the front end of printed circuit board 30. The high frequency filter 80 comprises a rectangular thin plate 81 of elastic insulation material such as polyester, a plurality of conductive wiring thin plates or layers $f_1, f_2, f_3 \ldots f_n$ secured in parallel to the surface of insulation thin plate 81 and extending from the connector 20 to the printed circuit board 30, and a conductive thin plate 82 of copper secured to the opposite surface of insulation thin plate 81. The dielectric constant and loss of insulation thin plate 81 are determined to be larger than those of the air, and the thickness of thin plate 81 is determined to be extremely thin (for instance, 12.5 $\mu$m-25 $\mu$m) in comparison with the surface area thereof. The whole length of insulation thin plate 81 perpendicular to the front wall 11 of casing 10 is determined to be larger (for instance, 40 mm-70 mm) than the distance between the front wall 11 of casing 10 and the front end of printed circuit board 30. Thus, as illustrated in FIG. 3, plate 81 is folded, with the fold extending parallel to front wall 11 and physically separating connector 20 from printed circuit board 30. In the high frequency filter 80, the copper thin plate 82 is opposed to the conductive wiring layers $f_1, f_2, f_3 \ldots f_n$ through the insulation thin plate 81 to provide an LCG constant filter circuit as decribed in detail later.

During the assembling process of the high frequency filter 80, the front end portion of copper thin plate 82 is supported by conductive support member 40e, and fixed in place by a pair of screws 83, 84 threaded into the bottom wall of casing 10 through the support member 40e (See FIGS. 2, 3). Thus, the copper thin plate 82 is connected to the bottom wall 12 of casing 10 through the support member 40e to provide a short circuit. As can be well seen in FIG. 3, the high frequency filter 80 is folded upwardly at its intermediate portion 80b and fixed at its rear end 80c to the front end of printed circuit board 30. In such arrangement, the wiring pattern layers $f_1, f_2, f_3 \ldots f_n$ are connected at one ends thereof to the respective external ends of wiring layers $d_1, d_2, d_3 \ldots d_n$ and at the other ends thereof to the respective connection pins $P_1, P_2, P_3 \ldots P_n$ of connector 20. Thus, the high frequency filter 80 is arranged in a limited space in the casing 10.

Figure 5:
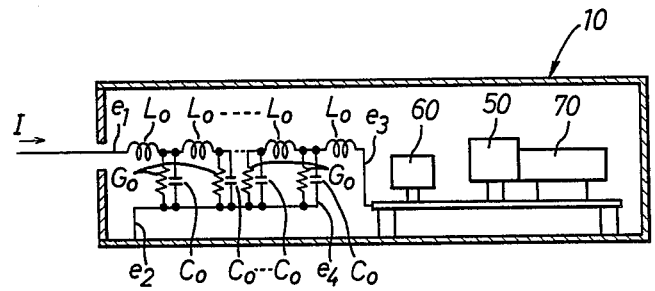
FIG. 5 illustrates a distributed constant circuit constituted by the high frequency filter.
Figure 6:
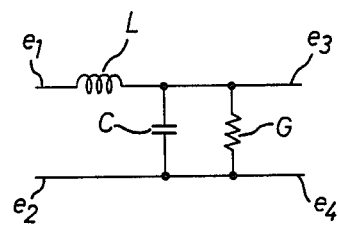
FIG. 6 illustrates an equivalent circuit of the distributed constant circuit shown in FIG. 5.

In the high frequency filter 80, the whole distributed electrostatic capacitance C between the copper thin plate 82 and the wiring layers $f_1-f_n$ is made sufficiently large by the fact that the dielectric constant of insulation thin plate 81 is larger than that of air and the thickness of thin plate 81 must be extremely thin to be folded. Furthermore, the whole distributed inductance L along the wiring layers $f_1-f_n$ is made large by the upwardly folded portions of the wiring layers $f_1-f_n$. Additionally, the dielectric loss of thin plate 81 is determined to be proportional to the dielectric constant of thin plate 81 and increases in proportion to the radio frequency of electromagnetic waves E. This results in increase of the whole distributed conductance G between the copper thin plate 82 and the wiring layers $f_1-f_n$. Thus, as is illustrated in FIG. 5, the high frequency filter 80 provides a distributed constant circuit including inductance elements $L_0$, electrostatic capacitance elements $C_0$ and conductance elements $G_0$ which are distributed in relation to the respective wiring layers $f_1, f_2, f_3 \ldots f_n$. In FIG. 6, there is illustrated an LCG constant filter circuit equivalent to the distributed constant circuit.

Assuming that as is illustrated in FIG. 1, the vehicle receives various electromagnetic waves E from a source of electromagnetic wave such as a broadcasting station, an amateur wireless station, a civil wireless station, a personal wireless system, a military radar system and the like, there will occur a high frequency inductive current I flowing to the high frequency filter 80 through the leading wires $W_1, W_2, W_3 \ldots W_n$ and connectors 20a, 20. In the high frequency filter 80, the inductive current I flows to the bottom wall 12 of casing 10 through the conductive support member 40e, while the flow of inductive current I to the power source circuit 50, switching circuit 60 and microcomputer 70 is reliably blocked. Thus, the power source circuit 70, switching circuit 60 and microcomputer 70 are applied with only signal currents from the sensors $S_1-S_n$ through the leading wires $W_1-W_n$, connectors 20a, 20 and wiring layers $f_1-f_n$ without any interference of the inductive current I. In this instance, resonance caused by the whole distributed inductance L and electrostatic capacitance C is effectively restrained by the sufficient distributed conductance G to effect the function of the high frequency filter 80 uniformly in a broad radio frequency band.

Figure 7:
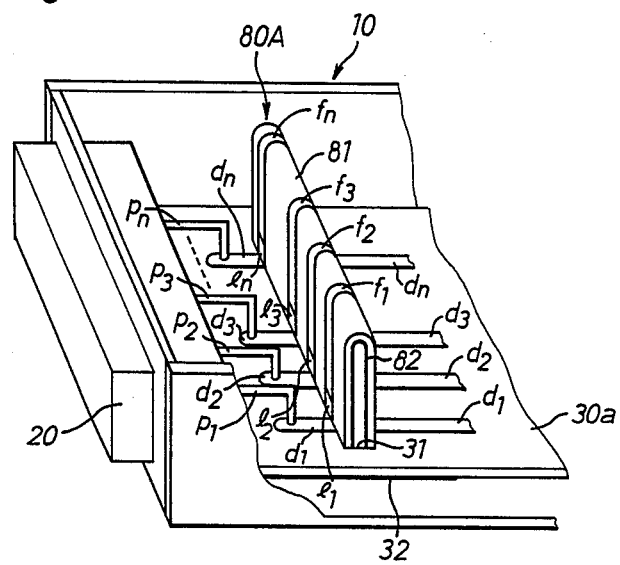
FIG. 7 is a prespective view showing a modification of the high frequency filter.

The high frequency filter 80 of the present invention may be modified as is illustrated in FIG. 7. In this modification, the folded portion 80b of filter 80 is formed as a high frequency filter 80A, and the remaining portion of insulation thin plate 81 is replaced with a printed circuit board 30a of insulation material. Thus, the wiring layers $d_1-d_n$ are formed on an extended portion of printed circuit board 30a and connected to the connection pins $P_1-P_n$ of connector 20. In such arrangement, the high frequency filter 80A is fixedly coupled with a longitudinal land hole 31 in the printed circuit board 30a. The respective sections of wiring pattern layers $d_1, d_2, d_3 \ldots d_n$ are integrally provided with a pair of opposed legs $l_1; l_2; l_3; l_n$ which are respectively connected to opposite lower ends of the wiring layers $f_1, f_2, f_3 \ldots f_n$. The upwardly folded copper thin plate 82 of filter element 80A extends downwardly through land hole 31 and is fixedly connected at its lower end to a copper thin plate 32 which is secured to the bottom surface of printed circuit board 30a and connected at its front end to the bottom wall 12 of casing 10 through the conductive support member 40e.

Figure 8:
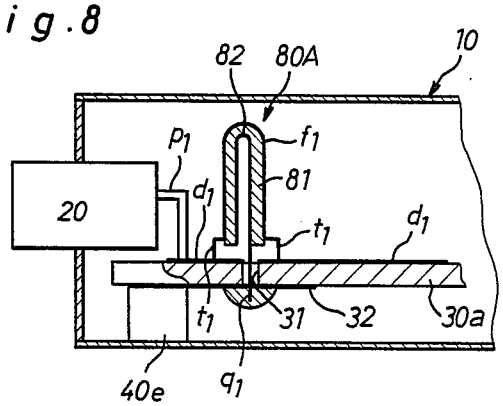
FIGS. 8 to 12 illustrate modifications of the high frequency filter respectively.
Figure 9:
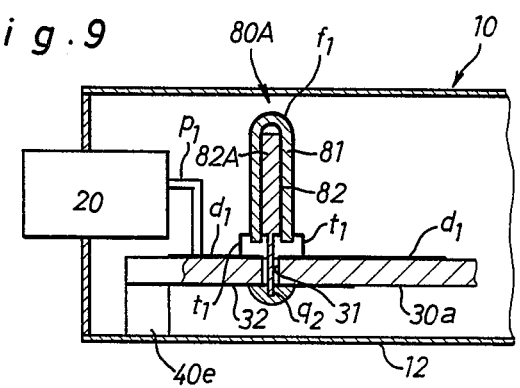

The high frequency filter element 80A may be further modified as is illustrated in FIG. 8, wherein the wiring layers $f_1$, $f_2$, $f_3$ ... $f_n$ of filter element 80A are respectively provided at their lower ends with leg $t_1$; ..., $t_n$ which extend downwardly and is secured to the respective sections of wiring layers $d_1$, $d_2$, $d_3$ ... $d_n$ to support the filter element 80A in place. Furthermore, the upwardly folded copper thin plate 82 of filter element 80A is integrally provided at its lower end with leg $q_1$ which extends downwardly through the land hole 31 and a portion of lower copper thin plate 32 and welded to the bottom surface of copper thin plate 32. Alternatively, the high frequency filter element 80A may be modified as is illustrated in FIG. 9, wherein a conductive metallic piece 82A is fixedly coupled within the upwardly folded copper thin plate 82. The conductive metallic piece 82A is integrally formed with leg $q_2$ which extends downwardly through the land hole 31 and a portion of lower copper thin plate 32 and is welded to the bottom surface of plate 32 to support the filter element 80A in place.

Figure 10:
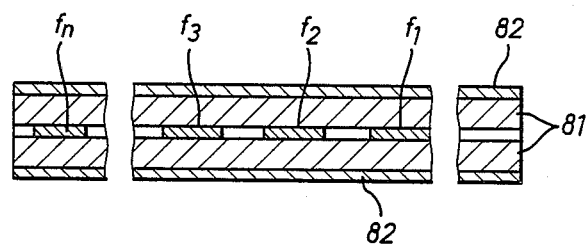
Figure 11:
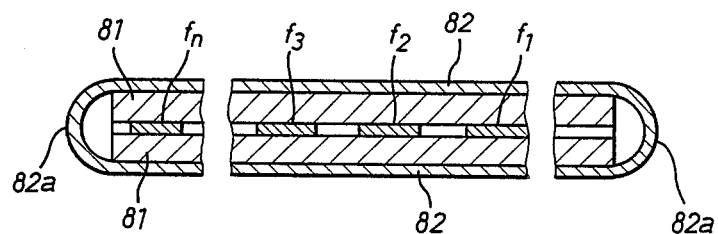
Figure 12:
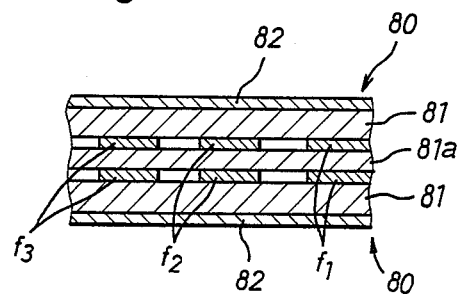

In FIG. 10 there is illustrated another modification of the high frequency filter element 80 in which a thin plate 81 of insulation material is securely mounted on the surface of wiring layers $f_1$, $f_2$, $f_3$ ... $f_n$, and a copper thin plate 82 is further secured to the surface of the additional insulation thin plate 81. In this modification, a pair of LCR constant filter circuits are symmetrically provided at the opposite sides of wiring layers $f_1$, $f_2$, $f_3$ ... $f_n$ to enhance the characteristic of the filter element 80. In FIG. 11, there is illustrated a further modification in which the copper thin plate 82, is integrally connected at end 82a to enclose the wiring layers $f_1$, $f_2$, $f_3$ ... $f_n$ so as to enhance an electric shield effect of the filter element. Alternatively, the high frequency filter element 80 may be further modified as is illustrated in FIG. 12, wherein a filter element 80 is integrally combined with each other through an insulation layer 81a of low dielectric constant and loss to provide a polymerized high frequency filter.

Figure 13:
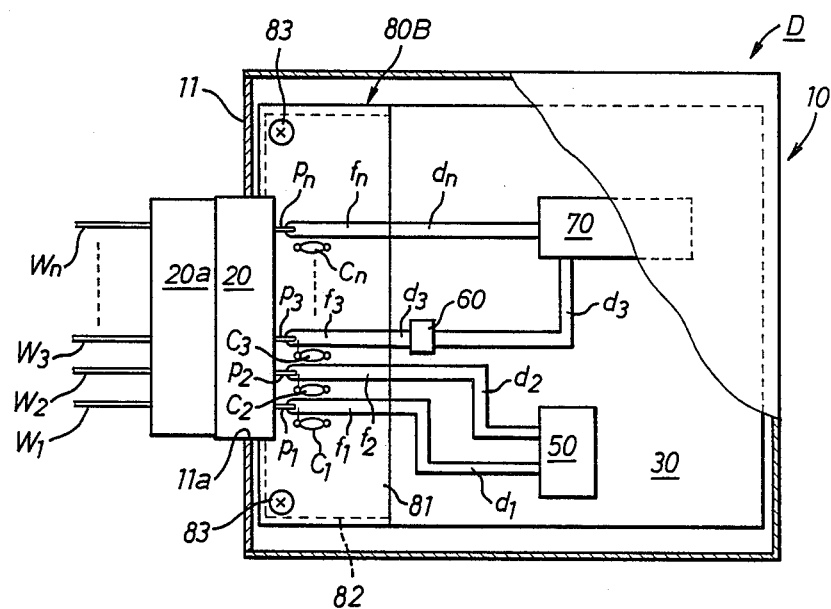
FIG. 13 is a transversely sectional view illustrating another embodiment of the high frequency filter adapted to the electronic control device.
Figure 14:
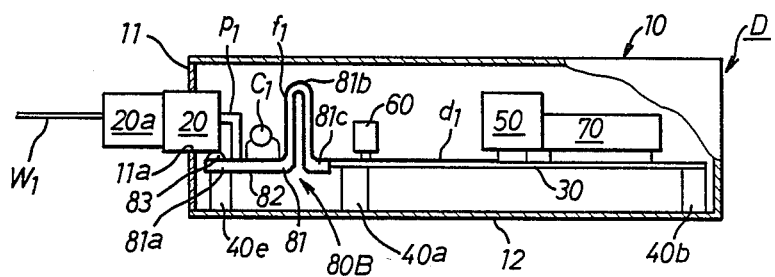
FIG. 14 illustrates a vertical section of the high frequency filter shown in FIG. 13.
Figure 15:
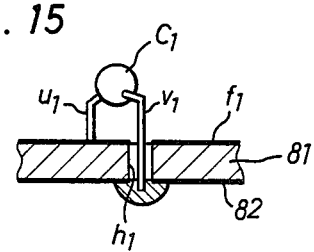
FIG. 15 illustrates a partial cross-section of the high frequency filter shown in FIGS. 13 and 14.
Figure 16:
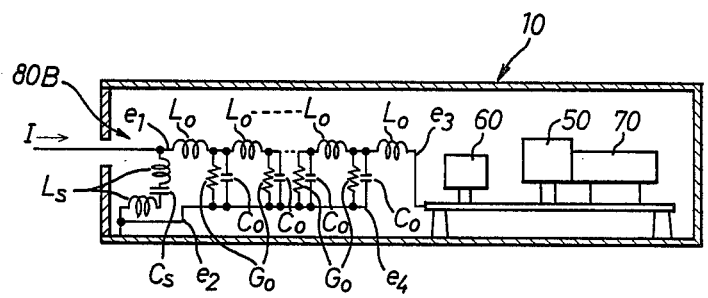
FIG. 16 illustrates a concentrated constant circuit and a distributed constant circuit constituted by the high frequency filter shown in FIGS. 13 and 14.
Figure 17:
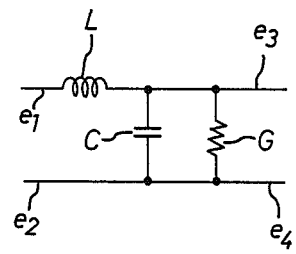
FIG. 17 illustrates an equivalent circuit of the distributed constant circuit shown in FIG. 16.
Figure 18:
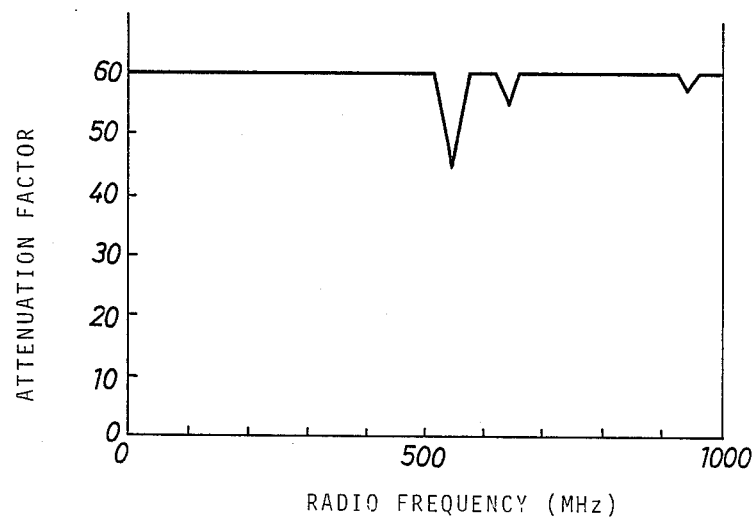
FIG. 18 is a graph illustrating an attenuation factor characteristic of the high frequency filter shown in FIGS. 13 and 14.

In FIGS. 13, 14 and 15 of the drawings, there is illustrated another embodiment of a high frequency filter 80B according to the present invention, wherein a plurality of capacitors $C_1$, $C_2$, $C_3$ ... $C_n$ are added to the high frequency filter 80 described above. The other construction is substantially the same as that of the high frequency filter 80. As can be well seen in FIGS. 14 and 15, the capacitors $C_1$, $C_2$, $C_3$ ... $C_n$ are respectively provided with a pair of connecting wires $u_1$, $v_1$; $u_2$, $v_2$; $u_3$, $v_3$; ... ; $u_n$, $v_n$. The connecting wire $u_1$ of capacitor $C_1$ is connected to an intermediate portion of wiring layer $f_1$, while the connecting wire $v_1$ of capacitor $C_1$ extends downwardly through land holes $h_1$ in the insulation thin plate 81 and copper thin plate 82 and is welded to the bottom surface of thin plate 82. The other capacitors $C_2$, $C_3$ ... $C_n$ are connected at their connecting wires $u_2$, $u_3$ ... $u_n$ to respective intermediate portions of wiring layers $f_2$, $f_3$ ... $f_n$ and at their connecting wires $v_2$, $v_3$ ... $v_n$ to the bottom surface of copper thin plate 82 in the same manner as described above. In such an arrangement, a concentrated constant circuit is constituted by each electrostatic capacitance $C_s$ of the capacitors $C_1$-$C_n$ and each inductance $L_s$ of the connecting wires $u_1$, $v_1$; $u_2$, $v_2$; $u_3$, $v_3$ ... $u_n$, $v_n$, as is illustrated in FIG. 16. FIG. 17 illustrates an equivalent circuit of the concentrated constant circuit. In this embodiment, the electrostatic capacitance $C_s$ is determined to be a small value for effecting the filtering function of filter 80B paricularly in a low radio frequency band (below 430 MHz). In each concentrated constant circuit of the capacitors $C_1$, $C_2$, $C_3$ ... $C_n$, a cut-off frequency is defined by $fc = \frac{1}{2}\pi\sqrt{lc}$. Thus, as is illustrated in FIG. 18, the filtering function of filter 80B is uniformly effected in a broad radio frequency band.

In operation of the high frequency filter 80B, the concentrated constant circuits of the capacitors $C_1$, $C_2$, $C_3$ ... $C_n$ are activated to cause the flow of a low radio frequency portion (below 430 MHz) of the inductive current I to the bottom wall 12 of casing 10 through the conductive support member 40e. Meanwhile, the LCG constant filter circuit, which consists of the insulation thin plate 81, copper thin plate 82 and wiring layers $f_1$-$f_n$, is activated to cause the flow of a high frequency portion (above 430 MHz) of the inductive current I to the bottom wall 12 of casing 10 through the conductive support member 40e. Thus, the power source circuit 50, switching circuit 60 and microcomputer 70 are protected from various inductive interferences in the broad radio frequency band to be applied with only the signal currents from the sensors $S_1$, $S_2$, $S_3$ ... $S_n$ through the leading wires $W_1$-$W_n$, connectors 20a, 20 and wiring layers $f_1$-$f_n$. Consequently, the microcomputer 70 operates without causing any error to ensure reliable control of the respective actuators $A_1$-$A_n$.

Figure 19:
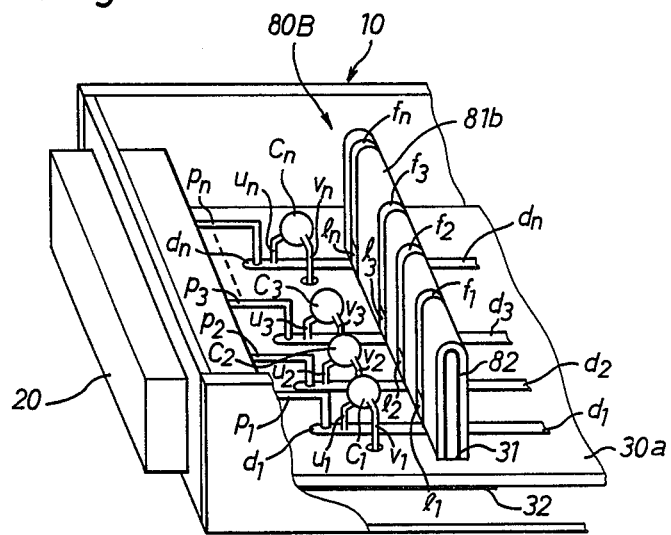
FIG. 19 is a perspective view of a modification of the high frequency filter shown in FIGS. 13 and 14.
Figure 20:
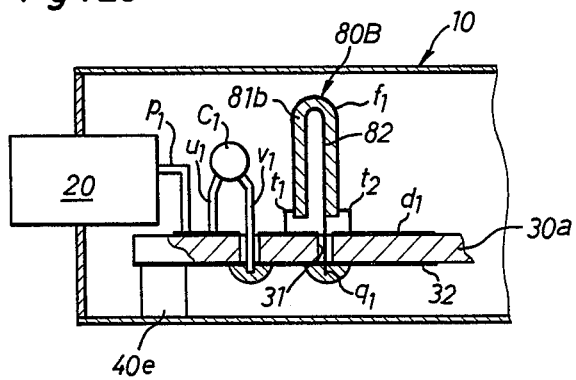
FIGS. 20 and 21 illustrate other modifications of the high frequency filter shown in FIGS. 13 and 14.
Figure 21:
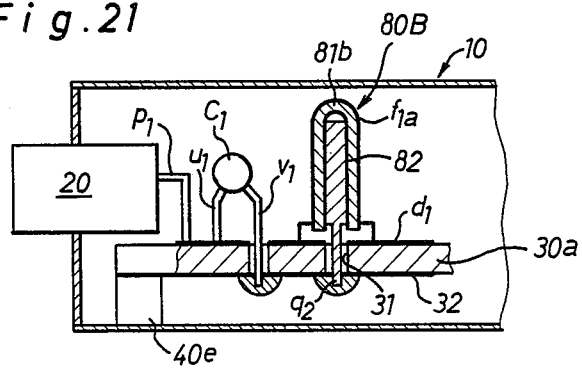

In FIG. 19, there is illustrated a modification of the high frequency filter 80B, wherein the upwardly folded portion 81b of insulation thin plate 81 is adapted to provide the high frequency filter 80B, and the remaining portion of thin plate 81 is replaced with a printed circuit board 30a of insulation material. Thus, the wiring layers $d_1$-$d_n$ are formed on an extended portion of print board 30a and connected to the connection pins $P_1$-$P_n$ of connector 20. In such arrangement, the capacitors $C_1$, $C_2$, $C_3$ ... $C_n$ are respectively connected at their connecting wires $u_1$, $u_2$, $u_3$ ... $u_n$ to the wiring layers $d_1$, $d_2$, $d_3$ ... $d_n$ and at their connecting wires $v_1$, $v_2$, $v_3$ ... $v_n$ to a copper thin plate 32 secured to the bottom surface of printed circuit board 32a. The other modified construction is substantially the same as that of the modification shown in FIG. 7. The high frequency filter 80B may be modified as is illustrated in FIG. 20, the modified construction of which is substantially the same as that of the modification shown in FIG. 8. Alternatively, the high frequency filter 80B may be modified as is illustrated in FIG. 21, the modified construction of which is substantially the same as that of the modification shown in FIG. 9.

It is to be understood that this invention is not to be limited to the exact construction shown and described but that various changes and modifications may be made without departing from the spirit and scope of the invention as defined in the appended claims.

What is claimed is:

1. A high frequency filter for an electric instrument including a casing of conductive metal insulated on a stationary structure, an internal electric circuit arranged within said casing and having a connection terminal spaced from an inner wall of said casing, and a connector mounted on a peripheral wall of said casing for connecting the connection terminal of said internal electric circuit to an external electric circuit, the high frequency filter comprising:

a folded insultation thin plate extending between said connector and the connection terminal of said internal electric circuit, said insulation thin plate having a fold extending in between and physically separating said connector from said internal electric circuit, the length of said insulation thin plate between said connector and said connection terminal, as measured up and over said fold, being larger than the distance between said connector and said connection terminal of said internal electric circuit; and a pair of conductive thin plates secured to opposite surfaces of said insulation thin plate and extending along said fold of said insulation thin plate, one of said conductive thin plates extending up and over said fold between said connector and said connection terminal and being electrically connected at one end thereof to said connector and at the other end thereof to the connection terminal of said internal electric circuit, and the other conductive thin plate being connected to a portion of said casing to provide a short circuit, said fold and said another conductive thin plate cooperating so as to reduce the effects of noise in said internal electric circuit.

2. A high frequency filter according to claim 1, further comprising a capacitor of small electrostatic capacitance mounted on said insulation thin plate and connected at one end thereof to the one of said conductive thin plates and at the other end thereof to the other conductive thin plate.

3. A high frequency filter according to claim 1, wherein a printed circuit board of insulation material is disposed within said casing to support thereon said internal electric circuit, and wherein said folded insulation thin plate is integrally connected at one end thereof to one end of said printed circuit board in such a manner that the one of said conductive thin plates is connected at one end thereof to the connection terminal of said internal electric circuit and at the other end thereof to said connector.

4. A high frequency filter for an electric instrument including a casing of conductive metal insulated on a stationary structure, an internal electric circuit arranged within said casing and having a plurality of connection terminals spaced from an inner wall of said casing, and a connector mounted on a peripheral wall of said casing for connecting the connection terminals of said internal electric circuit to a plurality of leading wires extending from an external electric circuit, wherein the high frequency filter comprises:

a folded insulation thin plate extending between said connector and the connection terminals of said internal electric circuit, said insulation thin plate having a fold extending in between and physically separating said connector from said internal electric circuit, the length of said insulation thin plate between said connector and said connection terminals as measured up and over said fold being larger than the distance between said connector and said connection terminals;

a plurality of conductive leads formed in parallel on one broad surface of said insulation thin plate and extending up and over said fold between said connector and said connection terminals and being electrically connected at their one ends to the connection terminals of said internal electric circuit and at their other ends to said connector; and a conductive thin plate secured to another broad surface of said insulation thin plate opposite said one broad surface and connected to said casing to provide a short circuit, said fold and said conductive thin plate cooperating so as to reduce the effects of noise on said internal electric circuit.

5. a high frequency filter for an electric instrument including a casing of conductive metal insulated on a stationary structure, a printed circuit board of insulation material arranged in place within said casing, an internal electric circuit mounted on said printed circuit board and having a connection terminal spaced from an inner wall of said casing, a connector mounted on a peripheral wall of said casing for connection to a leading wire extending from an external electric circuit, and a conductive wiring layer formed on one broad surface of said printed circuit board and connected at one end thereof to the connection terminal of said internal electric circuit and at the other end thereof to said connector, the high frequency filter comprising:

a folded insulation thin plate fixedly disposed on said one broad surface of said printed circuit board and having a fold arranged across said conductive wiring layer said fold extending in between and physically separating said connector from said internal electric circuit;

a first conductive thin plate secured to one broad surface of said insulation thin plate and extending up and over said fold, said first conductive thin plate being electrically connected at opposite ends thereof to sections of said conductive wiring layer separated by a land hole in said printed circuit board;

a second conductive layer secured to another broad surface of said insulation thin plate opposite said one broad surface and extending along said fold;

a third conductive thin plate secured to another broad surface of said printed circuit board opposite said one broad surface and being connected to said second conductive thin plate and connected to said casing to couple said insulation thin plate to said printed circuit board and to provide a short circuit, said fold cooperating with said third conductive thin plate to reduce the effects of noise on said internal electric circuit.

6. A high frequency filter according to claim 5, further comprising a conductive metallic piece disposed within said fold of said insulation thin plate, electrically connected with said second conductive thin plate and electrically connected with said third conductive thin plate.

7. A high frequency filter according to claim 5, further comprising a capacitor of small electrostatic capacitance mounted on said printed circuit board and connected at one end thereof to one of the sections of said conductive wiring layer and at the other end thereof to said third conductive thin plate.

8. A high frequency filter according to claim 1, further comprising a second insulation thin plate secured to said folded insulation thin plate through said first conductive thin plate; and a fourth conductive thin plate secured to a broad surface of said second insulation thin plate opposite said first conductive thin plate.

9. A high frequency filter according to claim 8, wherein said fourth conductive thin plate is integrally connected at opposite ends thereof to said second conductive layer to enclose said insulation thin plates.

* * * * *